(12) United States Patent
Goebel et al.

(10) Patent No.: US 6,309,930 B1
(45) Date of Patent: Oct. 30, 2001

(54) SRAM CELL ARRANGEMENT AND METHOD FOR MANUFACTURING SAME

(75) Inventors: Bernd Goebel; Emmerich Bertagnolli, both of München; Josef Willer, Riemerling; Barbara Hasler, Stockdorf; Paul-Werner von Basse, Wolfratshausen, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/708,636

(22) Filed: Nov. 9, 2000

Related U.S. Application Data

(62) Division of application No. 09/446,419, filed on Dec. 20, 1999, now Pat. No. 6,222,753.

(30) Foreign Application Priority Data

Jun. 27, 1997 (DE) .............................................. 197 27 472

(51) Int. Cl.⁷ .................................................. H01L 21/336
(52) U.S. Cl. ............................ 438/270; 438/589; 438/238
(58) Field of Search ................................... 438/129, 212, 438/268, 270, 587, 589, 238

(56) References Cited

U.S. PATENT DOCUMENTS

| | | | |
|---|---|---|---|
| 4,835,589 | 5/1989 | Pfiester | 257/304 |
| 4,876,215 | 10/1989 | Hsu | 438/270 |
| 5,016,070 | 5/1991 | Sundaresen | 257/331 |
| 5,258,635 | 11/1993 | Nitayama et al. | 257/330 |
| 5,285,093 | 2/1994 | Lage et al. | 257/332 |
| 5,324,973 | 6/1994 | Sivan | 257/330 |
| 5,330,927 | * 7/1994 | Lee | 438/270 |
| 5,879,971 | * 3/1999 | Witek | 438/270 |

FOREIGN PATENT DOCUMENTS

| | | |
|---|---|---|
| 42 15 708 | 11/1992 | (DE) . |
| 3-241865 | 10/1991 | (JP) . |
| 4-264770 | 9/1992 | (JP) . |
| 4-297067 | 10/1992 | (JP) . |
| 5-75066 | 3/1993 | (JP) . |
| 7-183399 | 7/1995 | (JP) . |
| 7-183400 | 7/1995 | (JP) . |
| WO89/02655 | 3/1989 | (WO) . |

OTHER PUBLICATIONS

Semiconductor International industries News, Nov. 1996, pp. 19–20.
"Short Channel Vertical NMOSFETs for High–Density Fast SRAMs," Perera et al., pp. 34.6.1–34.6.4, 1994.
"High–Density Thin Film Transistor Load SRAM Cell Using Trench DRAM Technology," IBM Technical Disclosure Bulletin, vol. 36, No. 09A, Sep. 1993, pp. 581–582.

* cited by examiner

*Primary Examiner*—Chandra Chaudhari
(74) *Attorney, Agent, or Firm*—Schiff Hardin & Waite

(57) ABSTRACT

The SRAM cell arrangement comprises six MOS transistors per memory cell that are fashioned as vertical transistors. The MOS transistors are arranged at sidewalls of trenches (G1, G2, G4). Parts of the memory cell such as, for example, gate electrodes (Ga2, Ga4) or conductive structures (L3) fashioned as spacer are contacted via adjacent, horizontal, conductive structures (H5) arranged above a surface (O) of a substrate (S). Connections between parts of memory cells ensue via third conductive structures (L3) arranged at the sidewalls of the depressions and word lines (W) via diffusion regions (D2) that are adjacent to the sidewalls of the depressions within the substrate (S), via first bit lines, via second bit lines (B2) or/and via conductive structures (L1, L2, L6) that are partially arranged at different height with respect to an axis perpendicular to the surface (O). Contacts (K5) contact a plurality of parts of the MOS transistors simultaneously.

5 Claims, 14 Drawing Sheets

SRAM CELL ARRANGEMENT AND METHOD FOR MANUFACTURING SAME

RELATED APPLICATION

The present application is a divisional application of copending application Ser. No. 09/446,419, filed in the U.S. Pat. and Trademark Office on Dec. 20, 1999 now U.S. Pat. No. 6,222,753.

BACKGROUND OF THE INVENTION

1. Field of the Invention

The present invention relates generally, to an SRAM cell arrangement having a plurality of memory cells, and more specifically to an SRAM cell arrangement wherein each of its memory cells respectively includes six vertical MOS transistors such that various contacts contact a plurality of parts of the transistor simultaneously.

2. Description of the Related Art

An SRAM cell arrangement is a memory cell arrangement with random access to stored information. In contrast to a DRAM cell arrangement wherein the information must be refreshed at regular time intervals, the information is statically stored in an SRAM cell arrangement.

What are referred to as 6T memory cells are being increasingly utilized in SRAM cell arrangements. A 6T memory cell includes four MOS transistors interconnected as a flipflop and two selection transistors. The flipflop is one of the two stable conditions. The condition of the flipflop represents a logical quantity, 0 or 1. By driving the selection transistors via a word line, the condition can be determined via two bit lines. Thus, the information can be read out and the condition can be modified and, thus, new information can be stored.

Since the memory density is increasing from memory generation to memory generation, the required area of the 6 T memory cell must be reduced from generation to generation. Semiconductor International (November 1996) pages 19 and 20, presents a 6T memory cell that can be manufactured with an area of 55 $F^2$, whereby F is the minimum structural size that can be manufactured in the respective technology. Self-aligned contacts (i.e., contacts without utilization of aligning masks), are produced and local connections (i.e., connections that lie within the cell), are utilized.

The present invention is based on the problem of specifying an SRAM cell arrangement that includes 6 T memory cells as memory cells and can be manufactured with especially high packing density. Further, a manufacturing method for such an SRAM cell arrangement should be specified.

SUMMARY OF THE INVENTION

Such problem is addressed by the present invention in an SRAM cell arrangement having a plurality of memory cells, wherein each memory cell includes six vertical MOS transistors with connections between parts being as follows. A first source/drain region of a first transistor is connected to a first source/drain region of a second transistor and to a first voltage terminal. A second source/drain region of the first transistor is connected to a first source/drain region of a third transistor, a first source/drain region of a fifth transistor, a gate electrode of the second transistor and a gate electrode of a fourth transistor. A gate electrode of the first transistor is connected to a second source/drain region of the second transistor, a first source/drain region of the fourth transistor, a gate electrode of the third transistor and a first source/drain region of a sixth transistor. A second source/drain region of the third transistor is connected to a second source/drain region of the fourth transistor and a second voltage terminal. A second source/drain region of the fifth transistor is connected to a first bit line. A gate electrode of the fifth transistor is connected to a gate electrode of the sixth transistor and to a word line. A second source/drain region of the sixth transistor is connected to a second bit line. The third transistor and the fourth transistor are complementary to the first transistor, the second transistor, the fifth transistor and the sixth transistor. It lies within the scope of the present invention for improving various properties of the memory cell for the SRAM cell arrangement to integrate further complements such as, for example, capacitors, into the memory cell in addition to the sixth transistors of the memory cell.

In the inventive SRAM cell arrangement, the sixth transistors of each memory cell are formed as vertical transistors. The area of the memory cell thereby becomes particularly small.

The six transistors are formed at sidewalls of stripe-shaped depressions proceeding parallel to one another, which can be formed as trenches in a substrate. As a result, the density of the connections is increased and the area of the memory cell is reduced. The first transistor and the second transistor are arranged at a second sidewall of a first trench; the fifth transistor and the sixth transistor are arranged at a second sidewall of a second trench; and the third transistor and the fourth transistor are arranged of a first sidewall of the fourth trench.

Third trenches filled with insulating material can, as insulating structures, insulate parts of transistors, which are complementary with one another.

It is advantageous to form gate electrodes of the six transistors as a spacer that adjoins a horizontal conductive structure arranged outside the depressions. The structure formed from the spacer, and the horizontal conductive structure is also referred to as strap. It enables a separate connection of the gate electrodes via an appertaining, horizontal, conductive structure to other parts of the transistors. For producing the horizontal, conductive structure before the production of the trenches, it is advantageous to generate a conductive layer. As a result, the spacer is connected in self-aligned fashion to the horizontal, conductive structure that arises from the conductive layer.

For diminishing the plurality of contacts, and thus, the area of the memory cell, it is advantageous to arrange contacts such that they partially overlap laterally with the horizontal conductive structures.

For increasing the density of the connections, and thus, for reducing the area of the memory cell, it is advantageous to employ a plurality of connection planes that conductive structures, bit lines and/or word lines.

So that no current flows along the sidewalls of the depressions between neighboring source/drain regions of different transistors, highly doped channel stop regions can be generated between the transistors by oblique implantation at the sidewalls of the depressions. The channel stop regions are doped with a conductivity type that is opposite the conductivity type of the neighboring source/drain regions.

For connecting neighboring source/drain regions that are located at a different height relative to an axis that proceeds perpendicular to a surface of the substrate, it is advantageous to generate highly doped diffusion regions. The diffusion regions can be generated by oblique implantation at parts of the sidewalls of the depressions. The diffusion regions are doped with the conductivity type of the neighboring source/drain regions.

When source/drain regions are generated after generating the depressions by implantation, then it is advantageous to provide the sidewalls of the depressions with spacers and to provide parts of the memory cell with a preliminary structure before the implantation in order to protect the sidewalls and the parts of the memory cell from the implantation.

It is advantageous to fashion the word line as a spacer along a sidewall of one of the depressions. The first bit line and the second bit line are formed transversely relative to the word line.

For reducing the area of the memory cell, it is advantageous when the fifth gate electrode of the fifth transistor and the sixth gate electrode of the sixth transistor are parts of the word line.

It is further advantageous to arrange memory cells neighboring along the first bit line mirror-symmetrically relative to an axis that proceeds along a center line of a depression, namely such that the depression is divided by the memory cells. The area of a memory cell is diminished as a result.

It is advantageous to form transistors complementary to one another at different depressions. As a result thereof floors of the depressions can be continuously doped by respectively one conductivity type and can be simultaneously employed as source/drain regions and as conductive structures.

It is advantageous to arrange a first insulating structure that, for example, can be formed as a depression filled with insulating material between a depression at which transistors are formed and a neighboring transmission at which complementary transistors are formed.

It is advantageous to form a first conductive structure or, respectively, a second conductive structure that is connected to a first voltage terminal or to a second voltage terminal respectively along a floor of a depression in the form of a doped region within the substrate. For reducing the area of the memory cell, it is advantageous when the first source/drain region of the first transistor and the first source/drain region of the second transistor are parts of the second conductive structure, and the second source/drain region of the third transistor and the second source/drain region of the fourth transistor are parts of the first conductive structure.

For increasing the density of the connections, it is advantageous to employ conductive structures arranged in an additional connecting level, these being arranged in the form of spacers at sidewalls of depressions and connecting parts of transistors.

Additional features and advantages of the present invention are described in, and will be apparent from, the Detailed Description of the Preferred Embodiments and the drawings.

DETAILED DESCRIPTION OF THE PREFERRED EMBODIMENTS

In the following, a formulation region $\alpha$ up to including region $\beta$ refers to all regions that are arranged within a memory cell between the region $\alpha$ and the region $\beta$ as well as the region $\alpha$ and the region $\beta$. $\alpha$ and $\beta$ respectively stand for a number or a letter.

In a first exemplary embodiment, a substrate S is a wafer of silicon.

Figure 1:
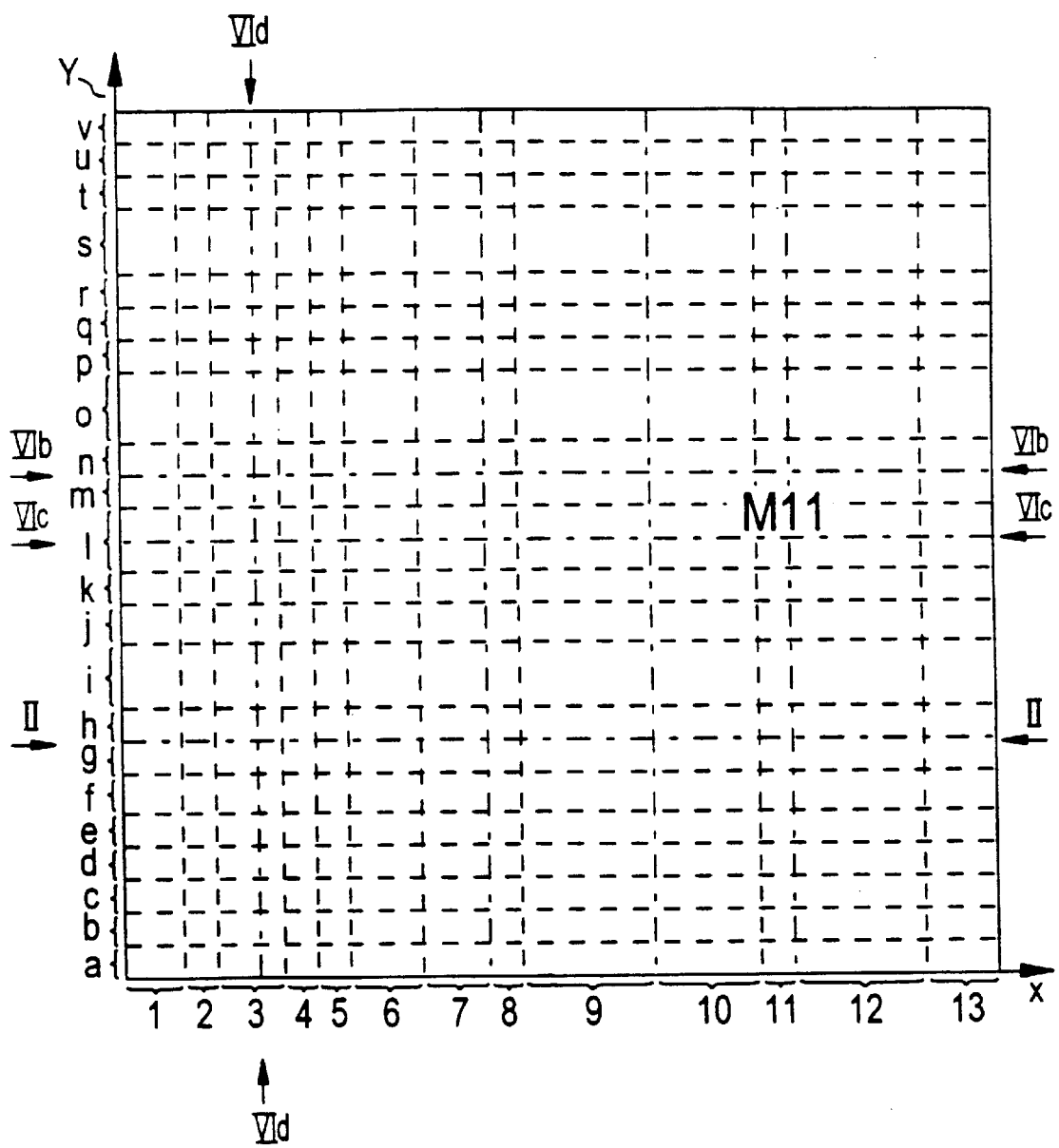
FIG. 1 shows a portion from a surface of a substrate which includes a memory cell. The surface is divided into horizontal regions and vertical regions which overlap the horizontal regions.

An x-axis x and a y-axis y perpendicular to the x-axis x proceed in a surface O of the substrate S (see FIG. 1). Parts of the surface O at which a respective memory cell is generated are respectively divided into stripe-shaped, horizontal regions adjoining one another and proceeding parallel to the x-axis x. The parts of the surface O are likewise divided into respective stripe-shaped, vertical regions joining one another and proceeding parallel to the y-axis (see FIG. 1). Memory cells, which are adjacent or neighboring, in the direction of the x-axis are generated mirror-symmetrically relative with one another with respect to axes proceeding parallel to the y-axis, i.e. either first vertical regions 1 or thirteenth vertical regions 13, of these memory cells adjoining one another. Of two neighboring memory cells to be generated in the direction of the y-axis, a first horizontal region a of one of the memory cells and a twenty second horizontal region v of another of adjoin one another.

With the assistance of a first mask (not shown) of photoresist which does not cover the tenth vertical region 10 and the eleventh vertical region 11 in memory cells, third trenches G3 approximately 500 nm deep are generated by etching silicon. The etchant is, for example, $HBr+NF_3+He+O_2$. By depositing $SiO_2$ in a thickness of approximately 600 nm in a TEOS process and subsequent re-etching, the third trenches G3 are filled with $SiO_2$. First insulating structures I1 thereby arise (see FIG. 2). The first insulating structures I1 are suitable for insulating parts of transistors complementary to one another that are to be produced from one another.

Figure 2:
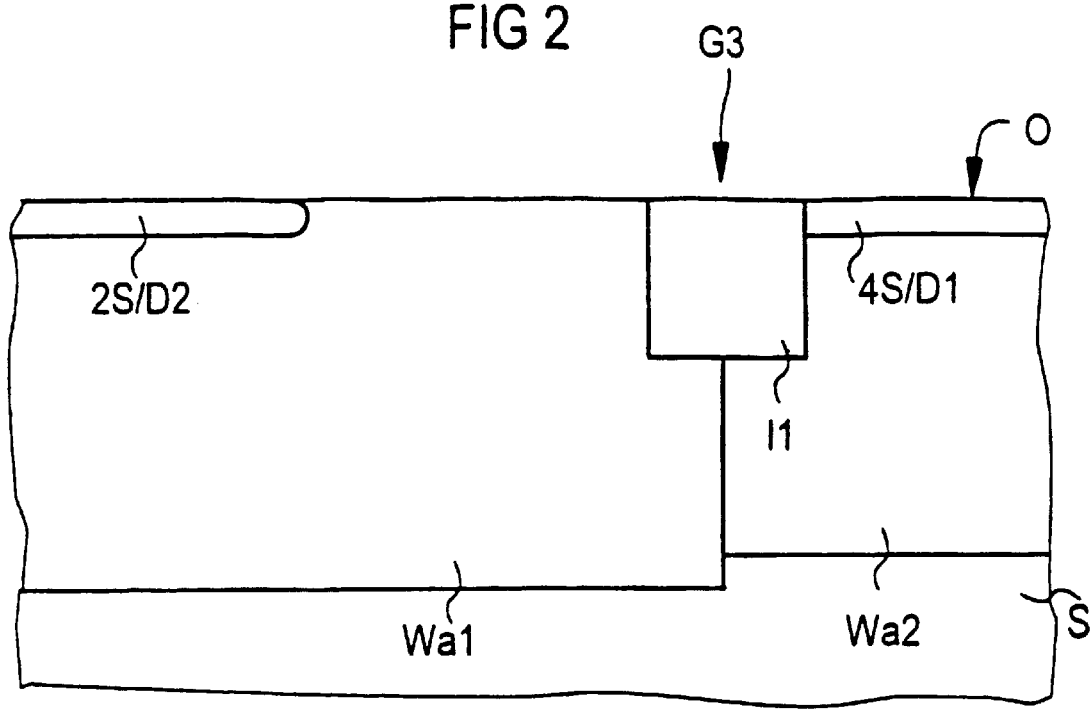
FIG. 2 shows a cross-section along a boundary line of a seventh horizontal region and an eighth horizontal region through the substrate after first insulating structures, first doped wells, second doped wells, first source/drain regions of fourth transistors, second source/drain regions of second transistors, second source/drain regions of first transistors, first source/drain regions of third transistors, second source/drain regions of fifth transistors and second source/drain regions of sixth transistors were produced.

With the assistance of a second mask (not shown) of photoresist, which covers the eleventh vertical region 11 through the thirteenth vertical region 13 in memory cells, approximately 2 $\mu$m deep p doped, first wells Wa1 are produced by implantation (see FIG. 2).

With the assistance of a third mask (not shown) of photoresist, that does not cover the eleventh vertical region 11 through the thirteenth vertical region 13 in the memory cells, approximately 2 $\mu$m deep n-doped second wells Wa2 are generated by implantation (see FIG. 2). The first insulating structures I1 proceed between a first well Wa1 and a second well Wa2. The first well Wa1 and the second well Wa2 are striped-shaped and proceed essentially parallel to one another. The dopant concentrations of the first wells Wa1 and of the second wells Wa2 amount to approximately $3\times10^{17}$ $cm^3$.

Figure 7A:
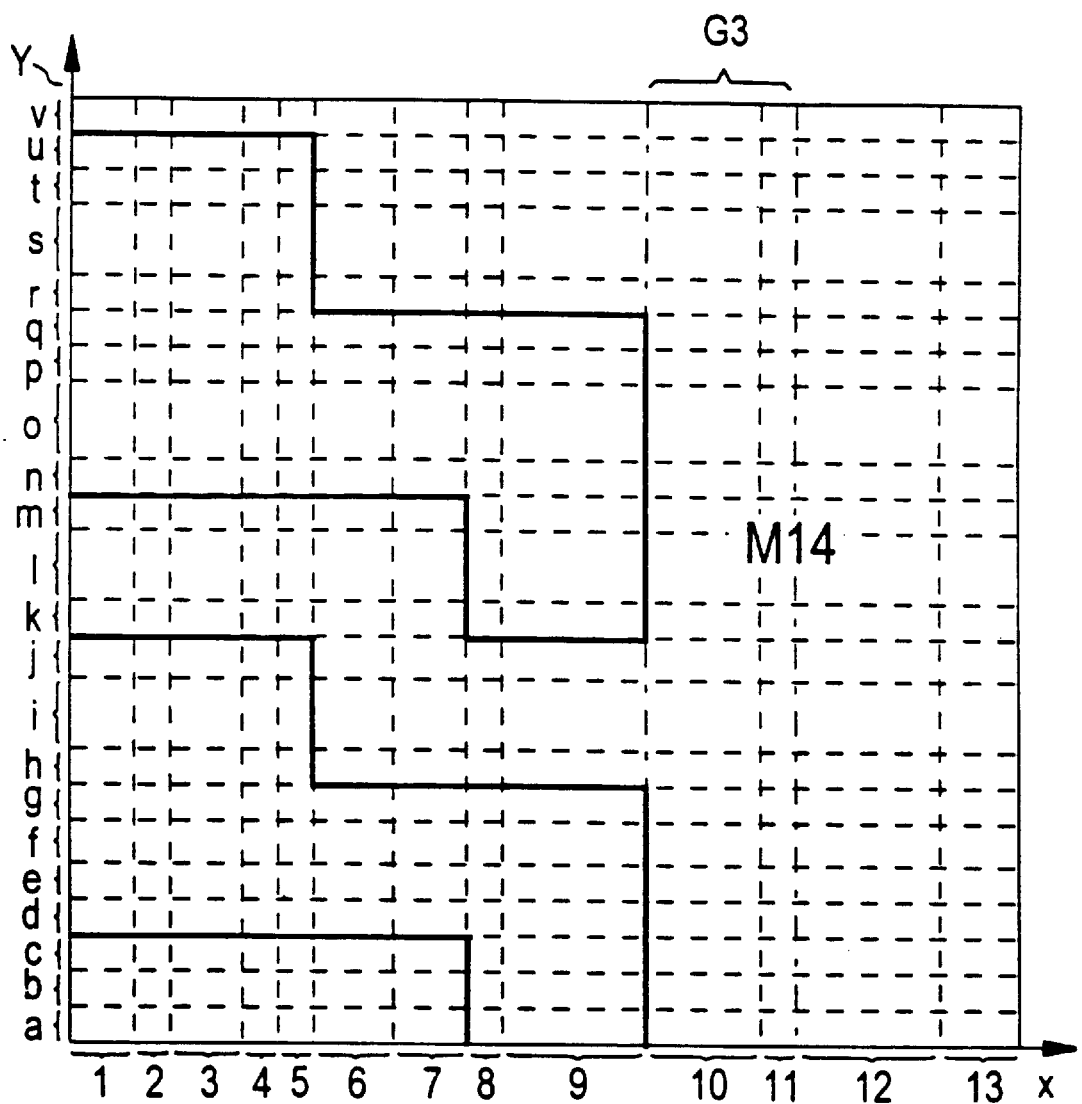
FIG. 7A shows the portion from FIG. 1 after the first insulating structures in the form of third trenches filled with insulating material were produced, and a fourth mask was applied onto the surface.

With the assistance of a fourth mask M4 of photoresist (see FIG. 7a), hook-shaped, n-doped regions approximately 150 nm deep are generated by implantation within the first well Wa1. The dopant concentration of the hook-shaped regions amounts to approximately $5\times10^{20}$ $cm^{-3}$. Parts of the hook-shaped regions are suitable as first source/drain regions 1 S/D1 of first transistors, as second source/drain regions 2 S/D2 of second transistors, as second source/drain regions 5 S/D2 of fifth transistors and as second source/drain regions 6 S/D2 of sixth transistors (see FIG. 2).

To that end, the fourth mask M4 does not cover regions in the memory cells wherein: the fourteenth horizontal region n through the twenty-first horizontal region u overlap with the first vertical region 1 through the fifth vertical region 5; wherein the fourth horizontal region d through the tenth horizontal region j overlap with the first vertical region 1 through the fifth vertical region 5; wherein the fourteenth horizontal region n through the seventeenth horizontal region q overlap with the sixth vertical region 6 and the seventh vertical region 7; wherein the fourth horizontal region d through the seventh horizontal region g overlap with the sixth vertical region 6 and the seventh vertical region 7; wherein the eleventh horizontal region k through the seventeenth horizontal region q overlap with the eighth vertical region 8 and the ninth vertical region 9; and wherein the first horizontal region a through the seventh horizontal region g overlap with the eighth vertical region 8 and the ninth vertical region 9.

With the assistance of a fifth mask (not shown) of photoresist, rectangular, p-doped regions approximately 150 nm deep are generated within the second wells Wa2. The dopant concentration of the rectangular regions amounts to approximately $5\times10^{20}$ $cm^{-3}$. The p-doped regions are suitable as first source/drain regions 3 S/D1 of third transistors and first source/drain regions 4 S/D1 of fourth transistors (see FIG. 2).

To that end, the fifth mask does not cover regions wherein: the fourteenth horizontal region n through the twentieth horizontal region t overlap with the eleventh vertical region 11 through the thirteenth vertical region 13; and wherein the third horizontal region c through the tenth horizontal region j overlap with the eleventh vertical region 11 through the thirteenth vertical region 13. Subsequently, a first insulating layer (not shown) is generated in that $SiO_2$ is deposited in a thickness of approximately 100 nm. An approximately 100 nm thick, conductive layer S1 is generated over the first insulating layer by deposition of doped polysilicon. A second insulating layer (not shown) is generated over the conductive layer S1 in that $SiO_2$ is deposited in a thickness of approximately 100 nm (see FIG. 3).

Figure 3:
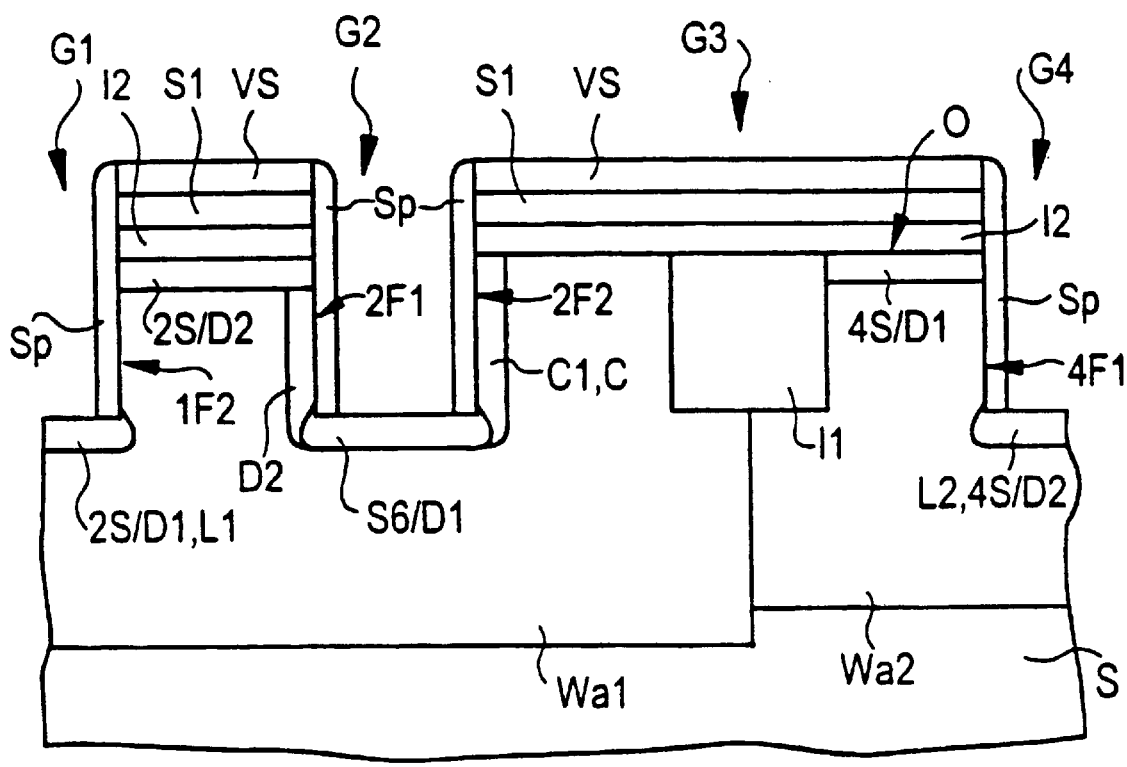
FIG. 3 shows the cross-section from FIG. 2 after a second insulating structure, a conductive layer, a preliminary structure, first trenches, second trenches, fourth trenches, channel stop regions, diffusion regions, spacers, first conductive structures, first source/drain regions of the first transistors, first source/drain region of the second transistors, first source/drain regions of the fifth transistor, first source/ regions of the sixth transistors, second conductive structures, second source/drain regions of the third transistors and second source/drain regions of the fourth transistors were produced.
Figure 7B:
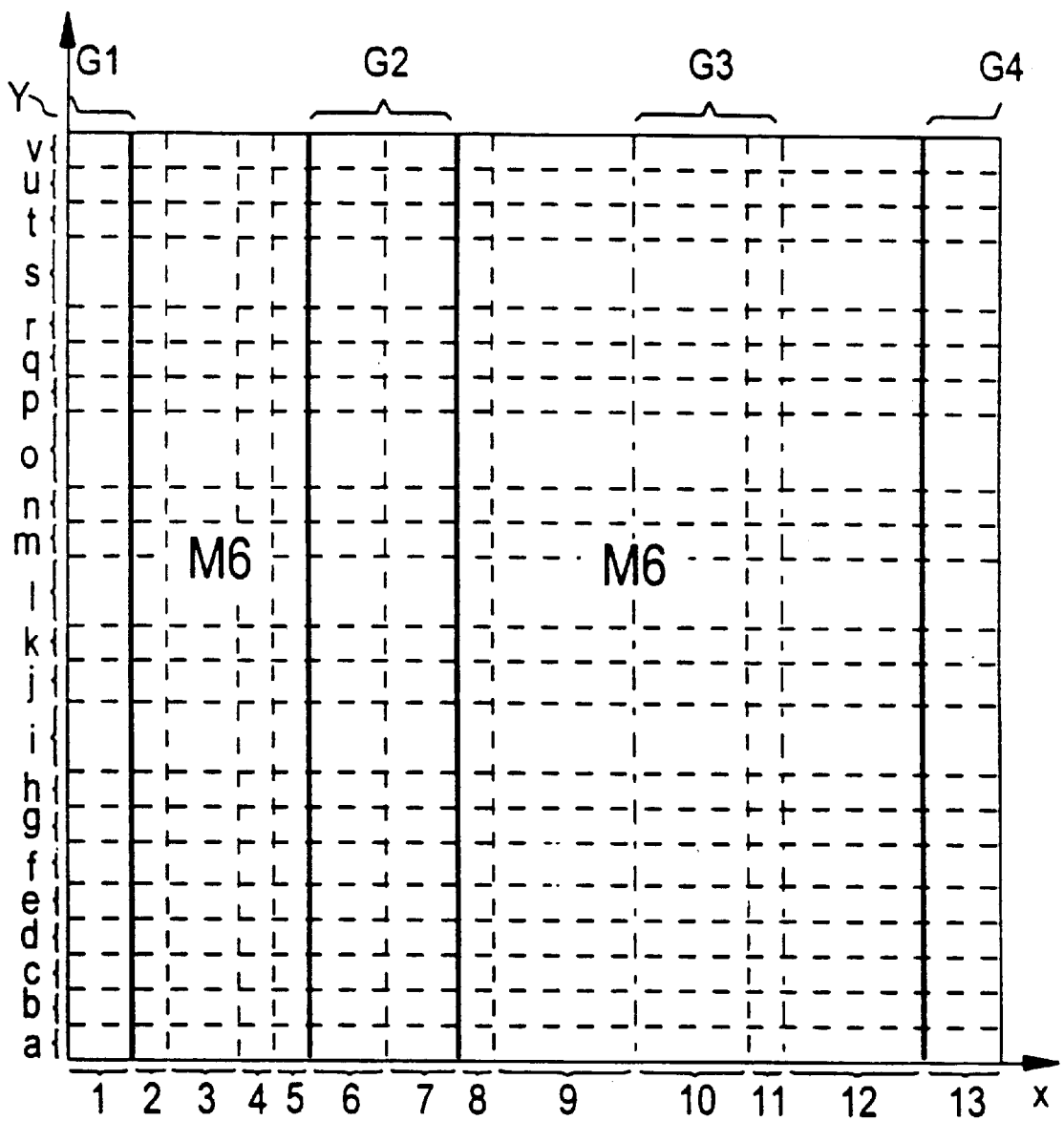
FIG. 7B shows the portion from FIG. 7A after the first trenches, the second trenches and the fourth trenches were produced with the assistance of a sixth mask.

With the assistance of a stripe-shaped, sixth mask M6 of photoresist (see FIG. 7b), approximately 500 nm deep, first trenches 01, second trenches 02 and fourth trenches 04 are produced parallel to the third trenches 03 by etching silicon and $SiO_2$ (see FIG. 3). The depth of the first trenches 01, of the second trenches G2 and of the fourth trenches 04 starting from the surface 0 amounts to approximately 500 nm. The first transistor 01 and the second trenches 02 proceed within the first wells Wa1.

The fourth trenches 04 proceed within the second wells Wa2. A second insulating structure 12 thereby arises from the first insulating layer, and a preliminary structure VS arises from the second insulating layer.

To that end, the sixth mask M6 does not cover the first vertical region 1, the sixth vertical region 6, the seventh vertical region 7, and the thirteenth vertical region 13 in the memory cells.

Figure 7C:
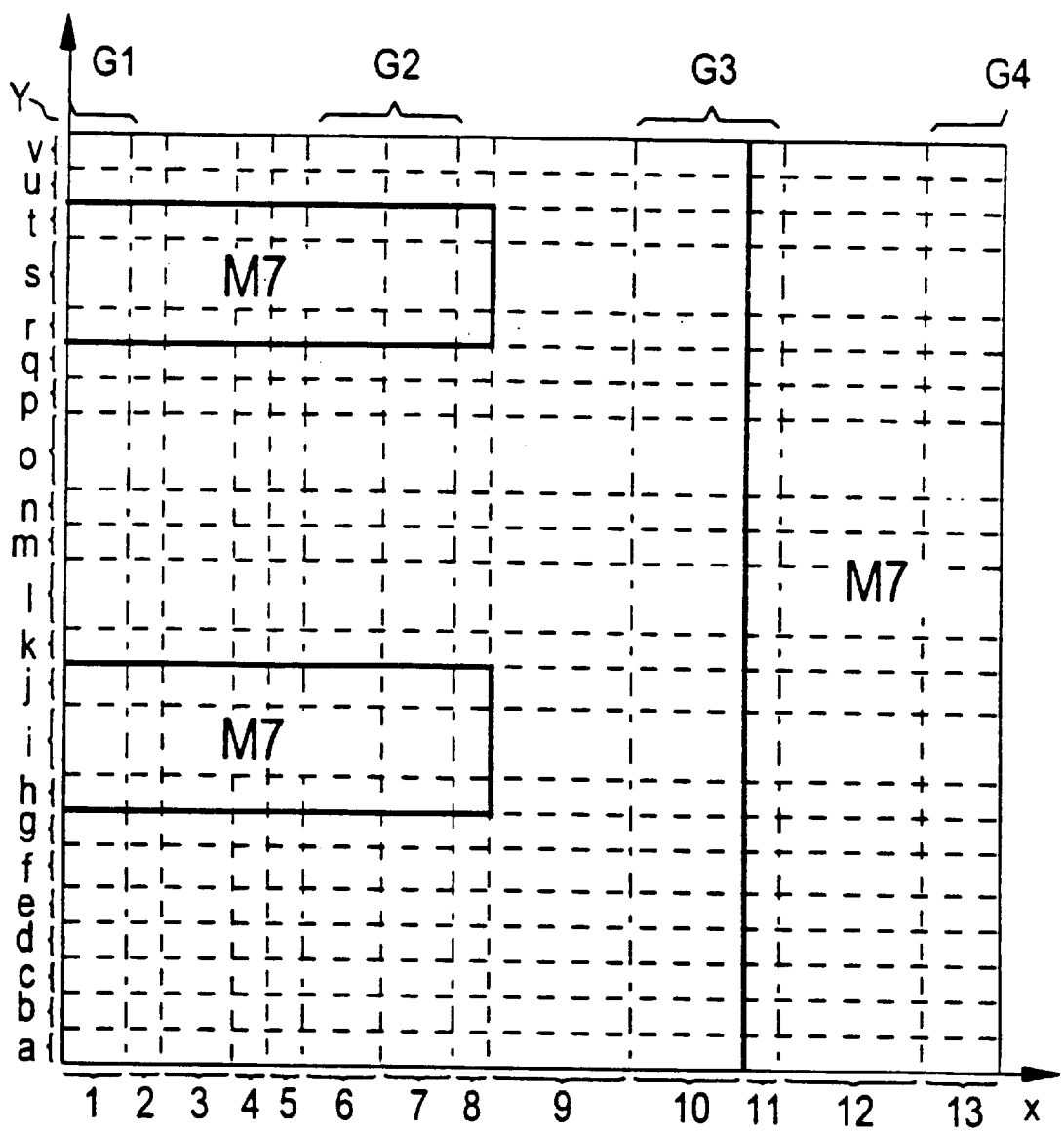
FIG. 7C shows the portion from FIG. 7B, whereupon a seventh mask was applied onto the surface.
Figure 7D:
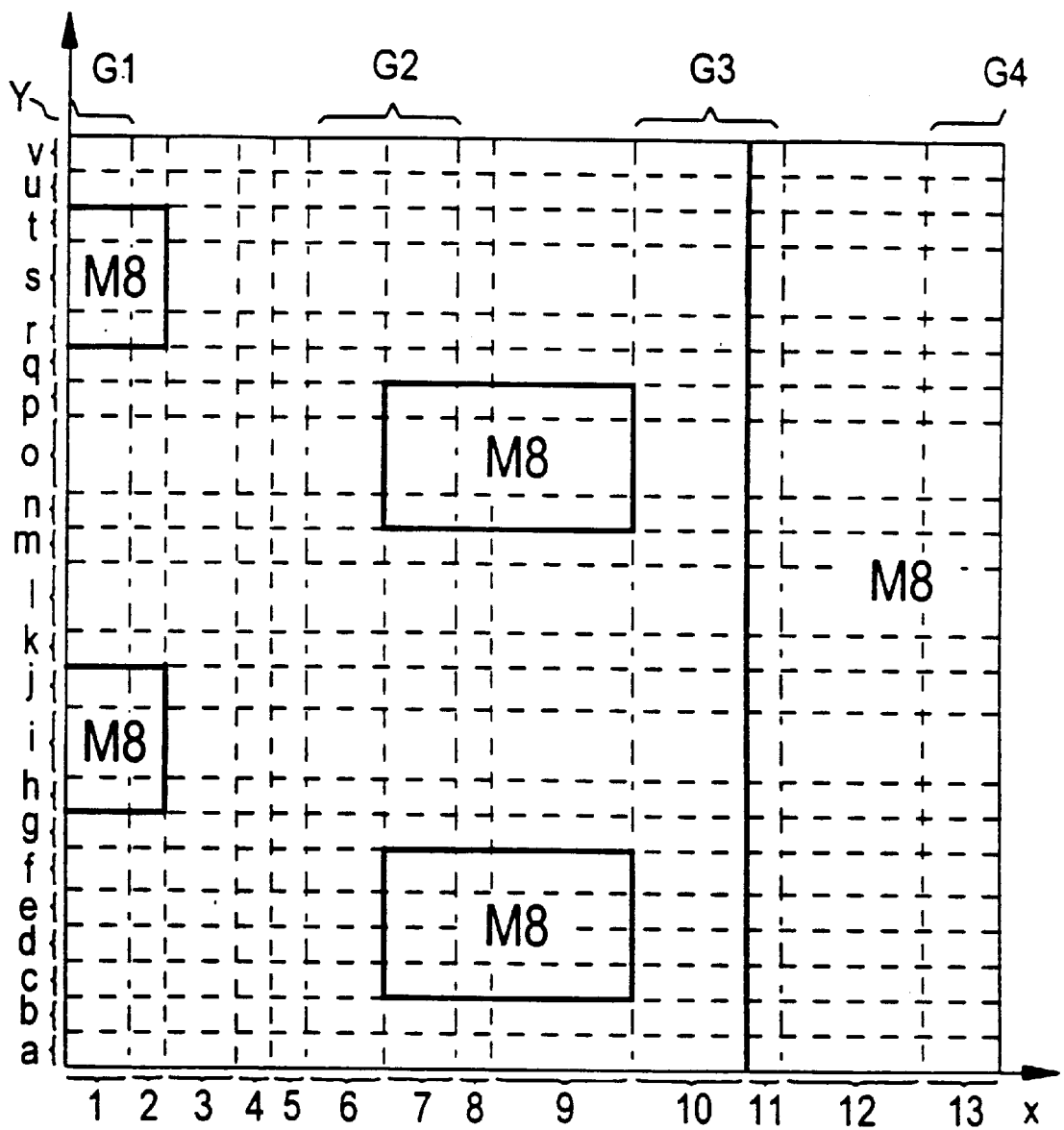
FIG. 7D shows the portion from FIG. 7C, whereupon an eighth mask was applied onto the surface.

With the assistance of a seventh mask M7 of photoresist (see FIG. 7c) and an eighth mask M8 of photoresist (see FIG. 7d), p-doped first channel stop regions CI are produced by oblique implantation at second sidewalls 1 F2 of the first trenches 01, at first sidewalls 2F1 of the second trenches 02 and at second sidewalls 2F2 of the second trenches 02 (see FIG. 3).

To that end, the seventh mask M7 covers the second well Wa2, as well as regions in the memory cells wherein: the eighteenth horizontal region r the twentieth horizontal region t overlap with the first vertical region I through the eighth vertical region 8; and wherein the eighth horizontal region h through the tenth horizontal region j overlap with the first vertical region 1 through the eighth vertical region 8. The eighth mask M8 covers the second well Wa2 in the memory cell, as well as regions wherein: the eighth horizontal region h through the tenth horizontal region j overlap with the first vertical region I and the second vertical region 2; wherein the eighteenth horizontal region r through the twentieth horizontal region t overlaps with the first vertical region 1 and the second vertical region 2; and regions wherein the fourteenth horizontal region n through the sixteenth horizontal region p overlaps with the seventh vertical region 7 through the ninth vertical region 9, and regions wherein the third horizontal region c through the sixth horizontal region f overlaps with the seventh vertical region 7 through the ninth vertical region 9.

Figure 6A:
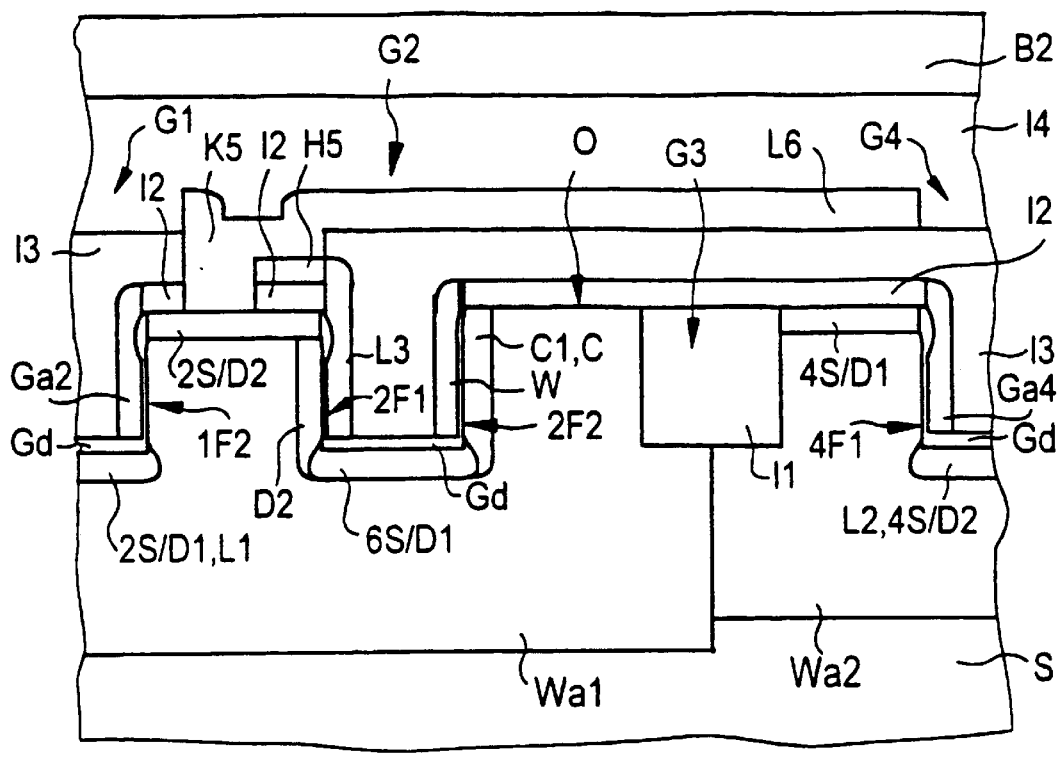
FIG. 6A shows the cross-section from FIG. 5 after a fourth insulating structure, first contacts, third contacts, seventh contacts, eighth contacts, fourth conductive structures, first bit lines and second bit lines were produced.
Figure 6B:
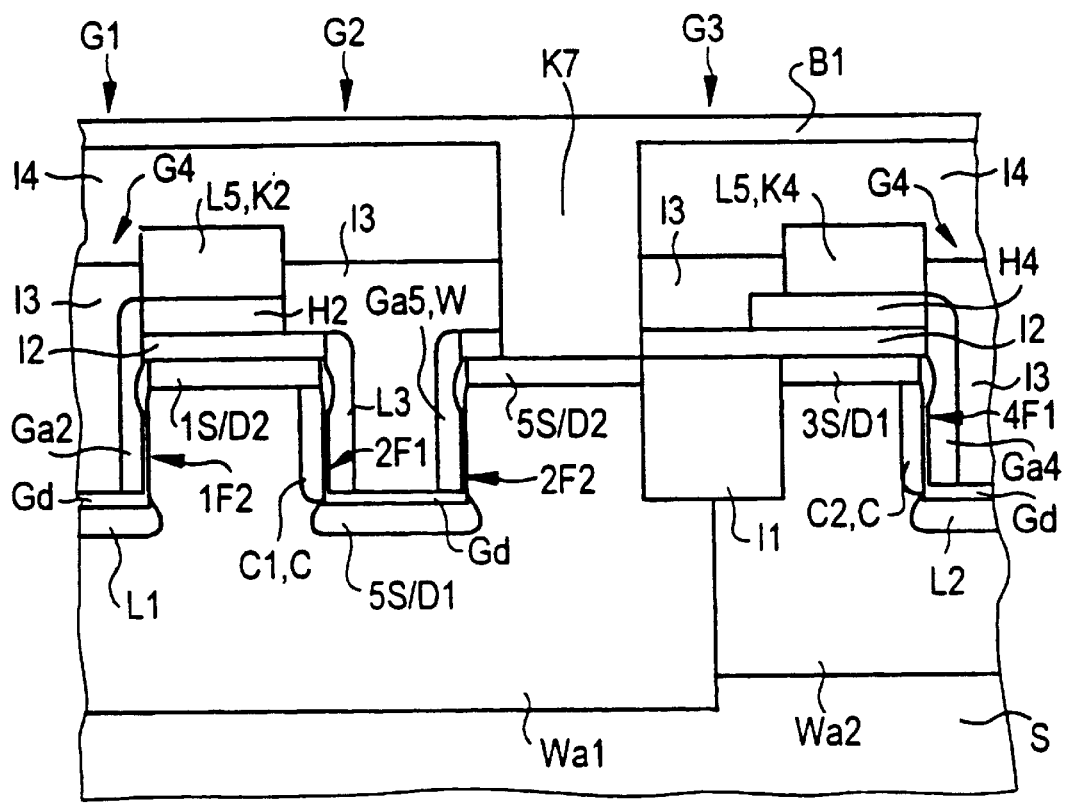
FIG. 6B shows the substrate from FIGS. 6A in a cross-section parallel to the cross-section of FIG. 6A along the one boundary line between a thirteenth horizontal region and a fourteenth horizontal region.
Figure 6C:
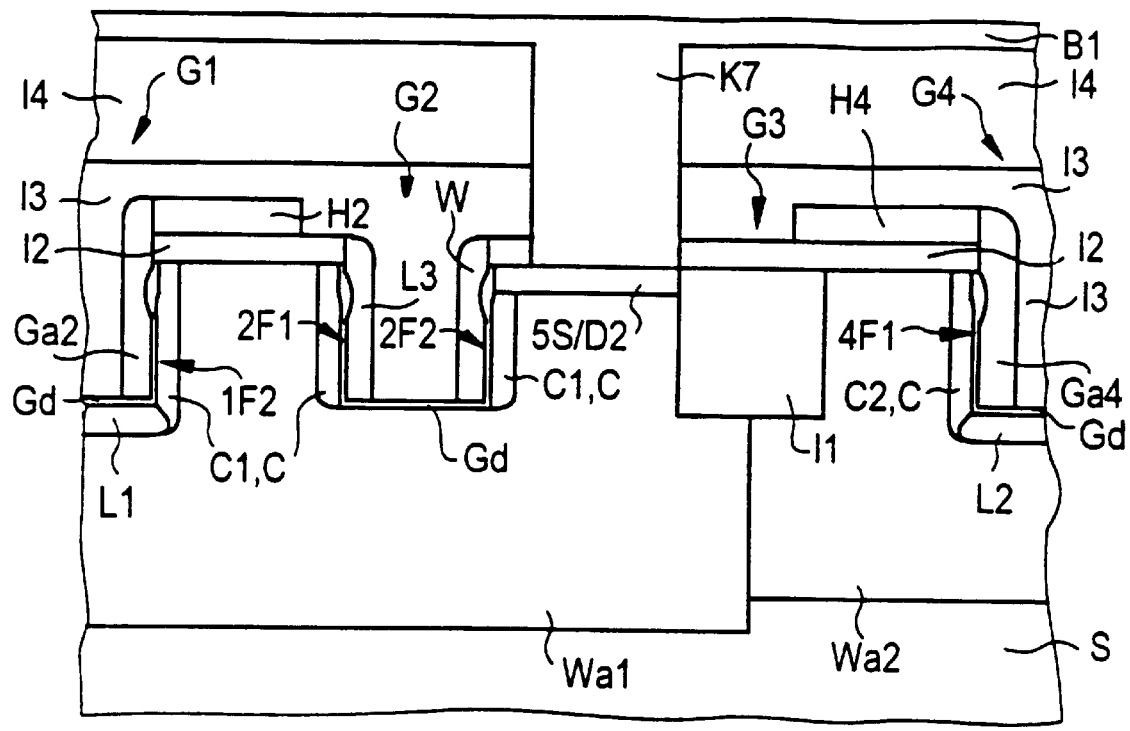
FIG. 6C shows the substrate of FIG. 6A in a cross-section parallel to the cross-section of FIGS. 6A along a twelfth horizontal region.

With the assistance of a ninth mask (not shown) of photoresist, n doped, second channel stop regions C2 are produced by oblique implantation at first sidewalls 4F1 of the fourth trenches G4 (not visible in the section shown in FIG. 3, see FIG. 6B)

To that end, the ninth mask in the memory cells covers the first wells Wa1 as well as regions wherein: the eighteenth horizontal region r through the twentieth horizontal region t overlaps with the twelfth vertical region 12 and the thirteenth vertical region 13, as well as regions wherein the eighth horizontal region h through the tenth horizontal region j overlap the twelfth vertical region 12 and the thirteenth vertical region 13.

The first channel stop regions CI and the second channel stop 20 regions 02 together form channel stop regions C. The dopant concentration of the channel stop regions C amounts to approximately $1 \times 10^{19}$ cm$^{-3}$ and is higher then the dopant concentration of the first wells Wa1 and of the second wells Wa2. As a result of their high dopant concentration, the channel stop regions C prevent a flow of current between neighboring source/drain regions.

With the assistance of a tenth mask (not shown) of photoresist, n doped diffusion regions are generated by oblique implantation at the first sidewalls 2F1 of the second trenches G2.

To that end, the tenth mask in the memory cells does not cover regions wherein: the seventeenth horizontal region q through the twenty-first horizontal region u overlap with the fourth vertical region 4 through the eighth vertical region 8; and wherein the seventh horizontal region g through the eleventh horizontal region k overlap with the fourth vertical region 4 through the eighth vertical region 8. The diffusion regions are divided into first diffusion and into second diffusion regions D2 (see FIG. 3).

The first diffusion regions adjoin the second source/drain regions 1 S/D2 of the first transistors, and the second diffusion regions D2 adjoin the second source/drain regions 2 S/D2 of the second transistors. The dopant concentration of the diffusion regions is high and amounts to approximately $1 \times 10^{20}$ cm$^{-3}$.

Subsequently, SiO$_2$ is deposited in a thickness of approximately 80 nm in a TEOS process and is etched back in order to generate spaces Sp at the second sidewalls 1F2 of the first trenches G1, at the first sidewalls 2F1 of the second trenches G2, at the second sidewalls 2F2 of the second trenches G2, at the first sidewalls 4F1 of the fourth trenches G4 and at the second sidewalls of the fourth trenches G4.

Figure 7E:
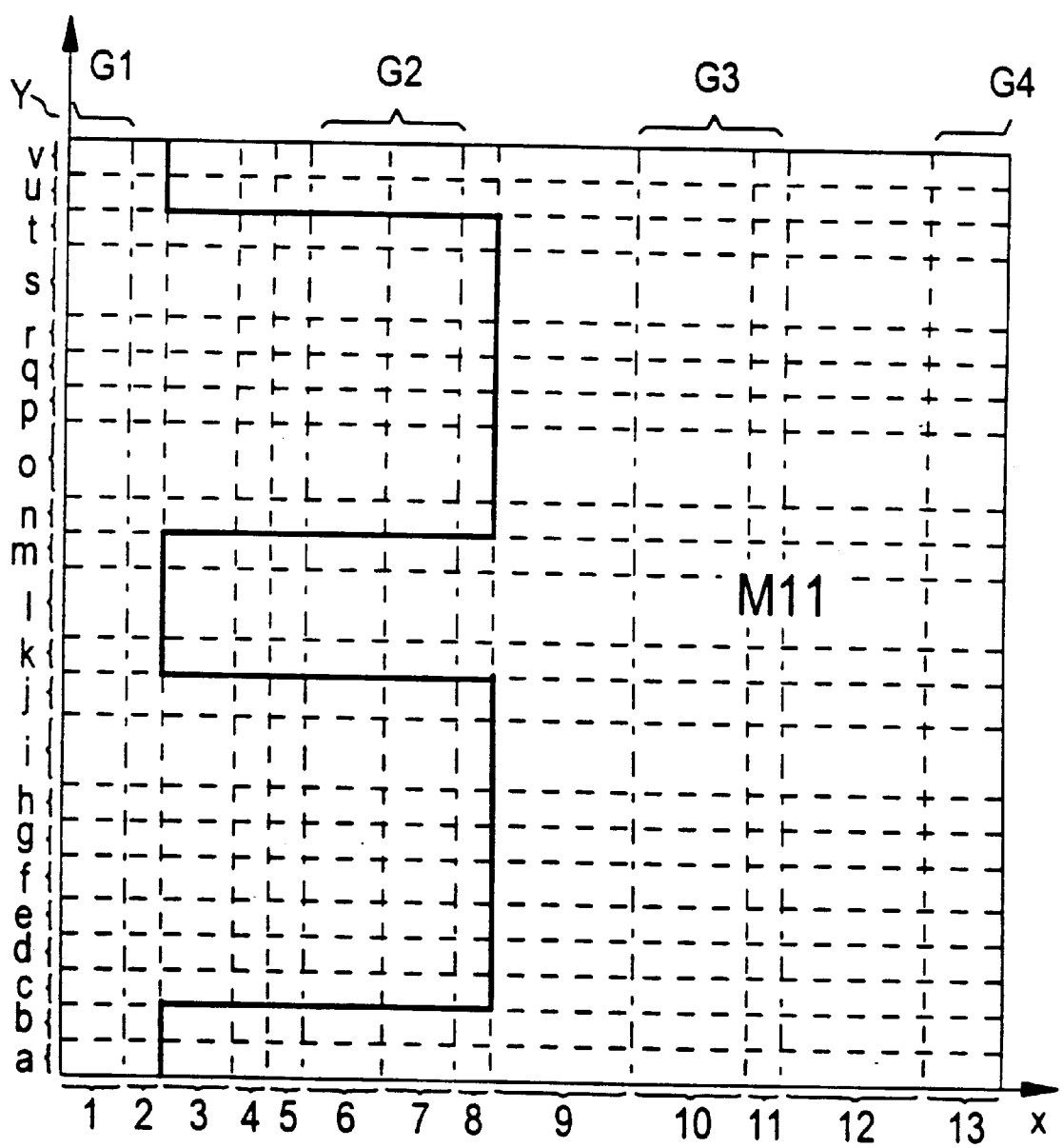
FIG. 7E shows the portion from FIG. 7D, whereupon an eleventh mask was applied onto the surface.
Figure 7F:
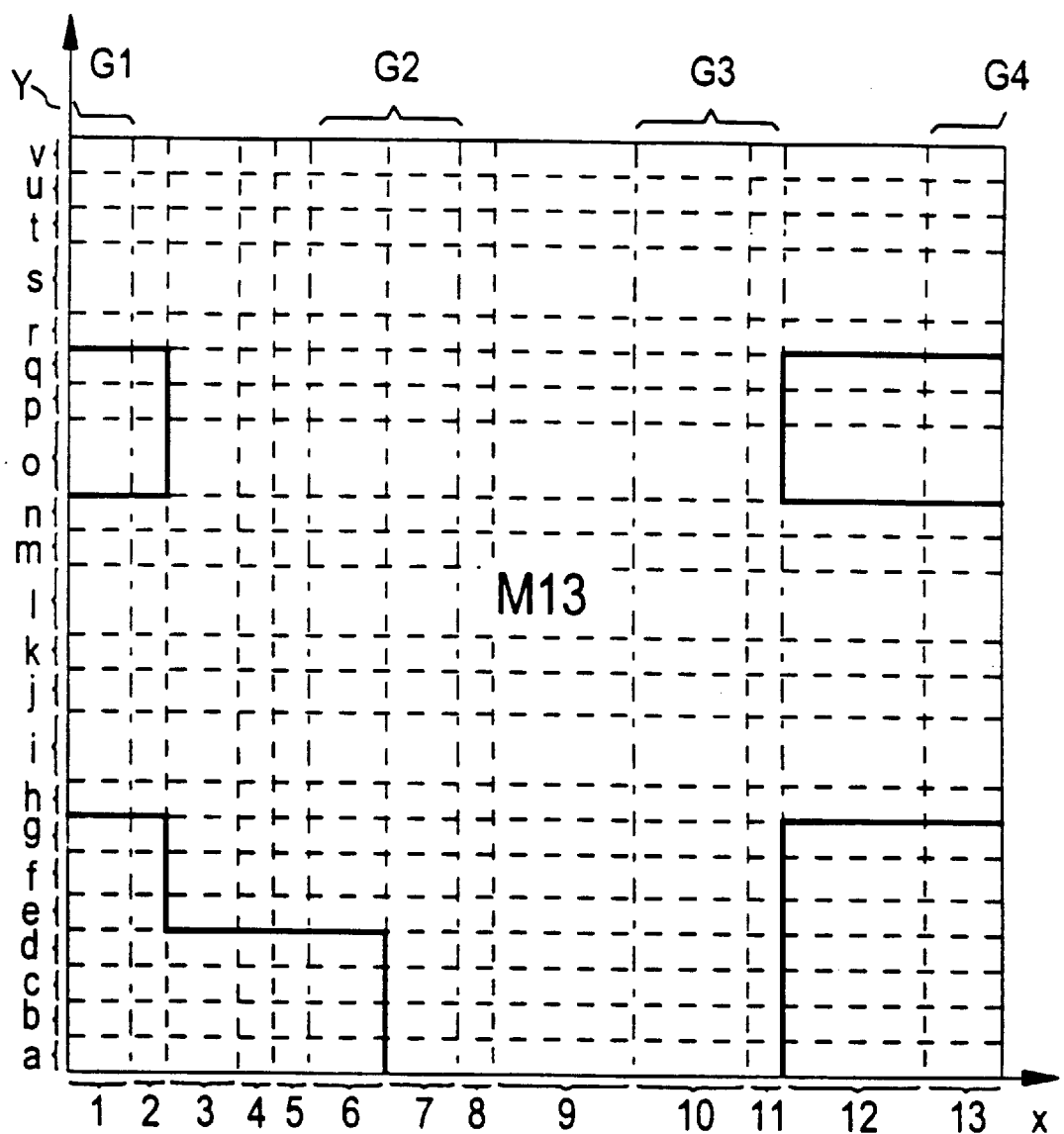
FIG. 7F shows the portion from FIG. 7E, whereupon a thirteenth mask was applied onto the surface.

With the assistance of an eleventh mask M11 of photoresist (see FIG. 7e), n-doped, first source/drain regions 5 S/D1 of the fifth transistors (not visible in the cross-section shown in FIG. 3, but see FIG. 6b) and first source/drain regions 6 S/D1 of the sixth transistors are generated by implantation at floors of the second transistors G2 with a respective dopant concentration of approximately $5 \times 10^{20}$ cm$^{-3}$ and n-doped, first conductive structures L1 are also generated at floors of the first trenches G1 (see FIG. 3). The first conductive structures L1 proceed along the floors of the first trenches G1 and are connected to a first voltage terminal. Parts of the first conductive structures L1 are suitable as first source/drain regions of the first transistors and as first source/drain regions 2 S/D1 of the second transistors (see FIG. 3).

To that end, the eleventh mask M11 in the memory cells does not cover the first trenches G1 nor regions wherein: the fourteenth horizontal region n through the twentieth horizontal region t overlap with the third vertical region 3 through the eighth vertical region 8, and rectangular regions; and wherein the third horizontal region c through the tenth horizontal region j overlap with the third vertical region 3 through the eighth vertical region 8. As a result, the first source/drain regions 5 S/D1 of the fifth transistors are insulated from the first source/drain regions 6 S/D1 of the sixth transistors.

With the assistance of a twelfth mask (not shown) of photoresist, which does not cover the fourth trenches G4 in the memory cells, p-doped, second conductor structures L2 are generated by implantation at the floors of the fourth trenches G4 (see FIG. 3). The dopant concentration of the second conductive structures L2 amounts to approximately $5 \times 10^{20}$ cm$^{-3}$. The second conductive structures L2 are connected to a second voltage terminal. Parts of the second conductive structure L2 are suitable as second source/drain regions of the third transistors and as second source/drain regions 4 S/D2 of the fourth transistors.

When producing the first source/drain regions 5 S/D1 of the fifth 15 transistors, the first source/drain regions 6 S/D1 of the sixth transistors, the first conductive structures L1 and the second conductive structures L2, the preliminary structure VS and the spacers Sp prevent the implantation of other parts of the memory cells. SiO$_2$ is etched with, for example, HF as enchant As a result, the preliminary structure VS is removed.

Subsequently, a deep dielectric Gd is generated by thermal oxidation (see FIG. 4). In order to remove parts of the gate dielectric Gd at sidewalls of the conductive layer 51 structured by the generation of the first trenches GI, of second trenches G2 and of the fourth trenches G4, doped polysilicon is deposited in a thickness of approximately 40 nm and is etched back to such an extent that the polysilicon is arranged in the form of spacers under the sidewalls of the structured, conductive layer Sl. Subsequently, SiO$_2$ is etched such with, for example, HF that sidewalls of the structured, conductive layer Sl are uncovered.

Doped polysilicon is deposited in a thickness of approximately 80 nm and is etched back. As a result, spacers that contact the structured, conductive layer 51 arise at the sidewalls of the first trenches Gi, of the second trenches G2 and of the fourth trenches G4.

With the assistance of a thirteenth mask M13 of photoresist (see FIG. 7D) silicon is etched such that parts of the spacers are removed. C$_2$F$_6$+O$_2$, for example, is suitable as an etchant. As a result, first gate electrodes of the first transistors, second gate electrodes Ga2 of the second transistors, third gate electrodes of the third transistors, fourth gate electrodes Ga4 of the fourth transistors, and third conductive structures L3 that are arranged at the first sidewalls 2F1 of the second trenches G2 arise (see FIG. 4). Spacers that are arranged at the second sidewalls 2F2 of the second trenches G2 are not etched and are suitable as word lines W. Parts of the word lines W are suitable as fifth gate electrodes GaS of the fifth transistors and as sixth gate electrodes of the sixth transistors.

To that end, the thirteenth mask M13 in the memory cells 15 does not cover regions wherein: the fifteenth horizontal region 0 through the seventh horizontal region q overlap with the first vertical region I and the second vertical region 2; wherein the fifteenth horizontal region 0 through the seventh horizontal region q overlap with the twelfth vertical region 12 and the thirteenth vertical region 13; wherein the first horizontal region a through the seventh horizontal region g overlap with the first vertical region I and the second vertical region 2; wherein the first horizontal region a through the fourth horizontal region d overlap with the third vertical region 3 through the sixth vertical region 6; and wherein the first horizontal region a through the seventh horizontal region g overlap with the twelfth vertical region 12 and the thirteenth vertical region 13.

Figure 4:
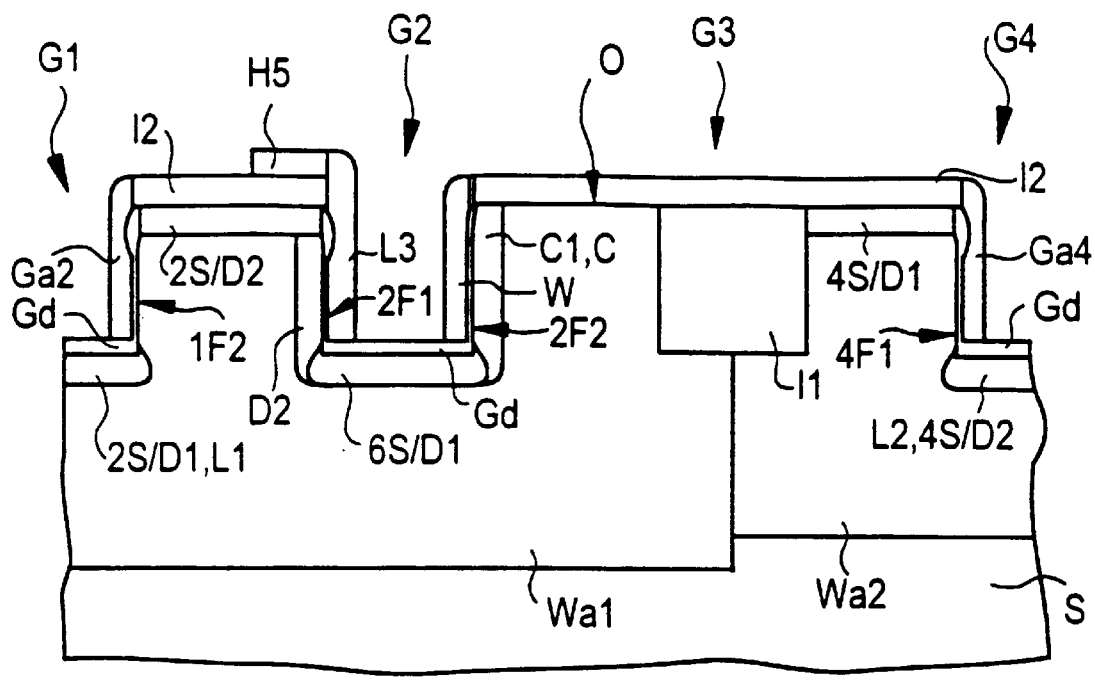
FIG. 4 shows the cross-section from FIG. 3 after a gate dielectric, gate electrodes, third conductive structures and horizontal, conductive structures were produced.
Figure 6D:
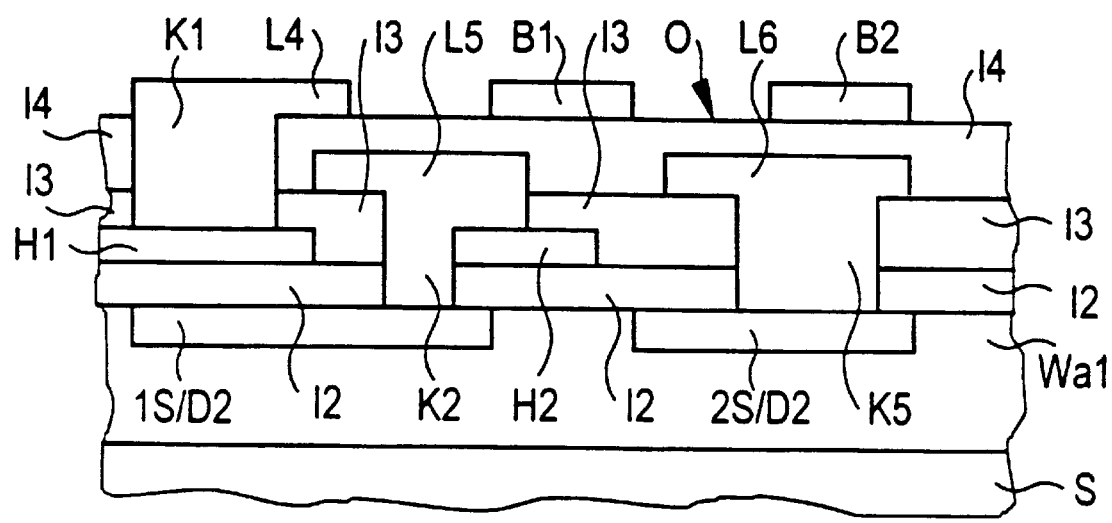
FIG. 6D shows a cross-section perpendicular to the cross-section of FIG. 6A through the substrate of FIG. 6A along a third vertical region.
Figure 7G:
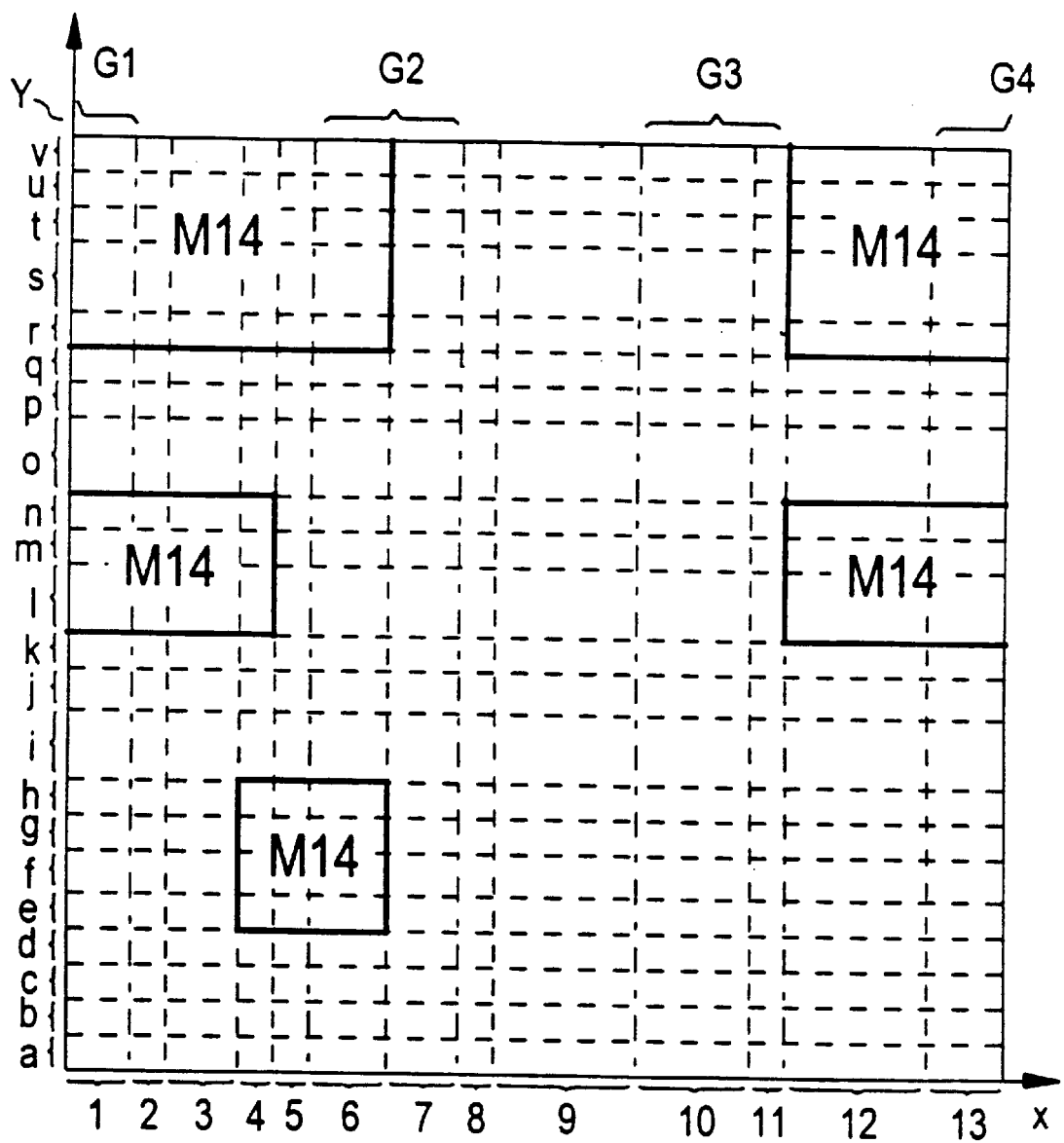
FIG. 7G shows the portion from FIG. 7F, whereupon a fourteenth mask was applied onto the surface.

With the assistance of a fourteenth mask M14 of photoresist (see FIG. 7G), first horizontal, conductive structures H1, second horizontal, conductive structures H2, third horizontal, conductive structures, fourth horizontal, conductive structures H4, and fifth horizontal conductive structures H5 arise from the structure, conductive layer S1 (see FIGS. 4, 6B, 6D). $C_2F_6+O_2$, for example, is suitable as an etchant.

To that end, the fourteenth mask M14 covers regions wherein: the eighteenth horizontal region r through the twenty-first horizontal region v overlap with the first vertical regions I through the sixth vertical region 6; wherein the twelfth horizontal region I through the fourteenth horizontal region n overlap with the first vertical region 1 through the fourth vertical region 4; wherein the eighteenth horizontal regions are through the twenty-first horizontal region v overlap with the eleventh vertical region II through the thirteenth vertical region 13: wherein the twelfth horizontal region I through the fourteenth horizontal region n overlap with the eleventh vertical region 11 through the thirteenth verbal region 13; and wherein the fifth horizontal region e through the eighth horizontal region h overlap with the fourth vertical region 4 through the sixth vertical region 6. The first horizontal conductive structures H1 adjoin the first gate electrodes Ga1 of the third transistors and at the third conductive structures L3. The second horizontal conductive structures H2 adjoin the second gate electrodes Ga2 of the second transistors. The third horizontal conductive structures adjoin the third gate electrode Ga3 of the third transistors. The fourth horizontal conductive structures H4 adjoin the fourth gate electrodes Ga4 of the fourth transistors. The fifth horizontal conductive structures H5 adjoin the third conductive structures L3.

Figure 5:
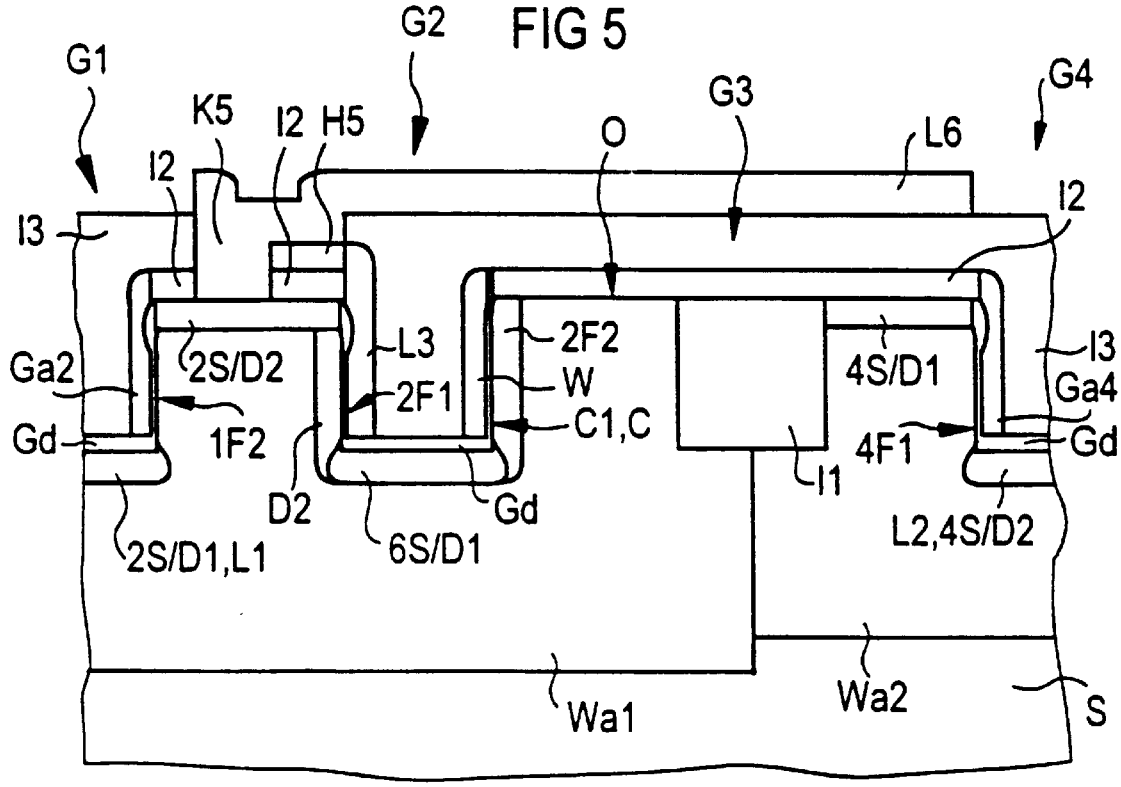
FIG. 5 shows the cross-section from FIG. 4 after second contacts, fourth contacts, fifth contacts, sixth contacts, fifth conductive structures, sixth conductive structures and a third insulating structure were produced.

Subsequently, $SiO_2$ is deposited in a thickness of approximately 600 nm in a TEOS process. By chemical-mechanical polishing, 500 nm $SiO_2$ is eroded and planarized, a third insulating structure 13 arising as a result thereof (see FIG. 5).

The generation of second contacts K2 that contact the second source/drain regions I S/D2 of the first transistors, a fourth contacts that contact the first source/drain regions 3 S/DI of the third transistors, of fifth contacts K2 that contact the second source/drain regions 2 S/D2 of the second transistors and of sixth contacts that contact the first source/drain regions 4 S/D1 of the fourth transistors, $SiO_2$ is selectively etched relative to silicon with the assistance of a fifteenth mask (not shown) of photoresist until parts of the source/drain regions are uncovered. $CHF_3+O_2$, for example, is suitable as an etchant.

To that end, the fifteenth mask in the memory cells does not cover regions wherein: the thirteenth horizontal region M through the fifteenth horizontal region 0 overlap with the second vertical region 2 through the fourth vertical region 4; wherein the fifth horizontal region e through the eighth horizontal region h overlap the third vertical region 3 through the fifth vertical region 5; wherein the thirteenth horizontal region m through the fifteenth horizontal region 0 overlap with the twelfth vertical region 12; and wherein the third horizontal region c through the six horizontal region f overlap with the twelfth vertical region 12.

Figure 7H:
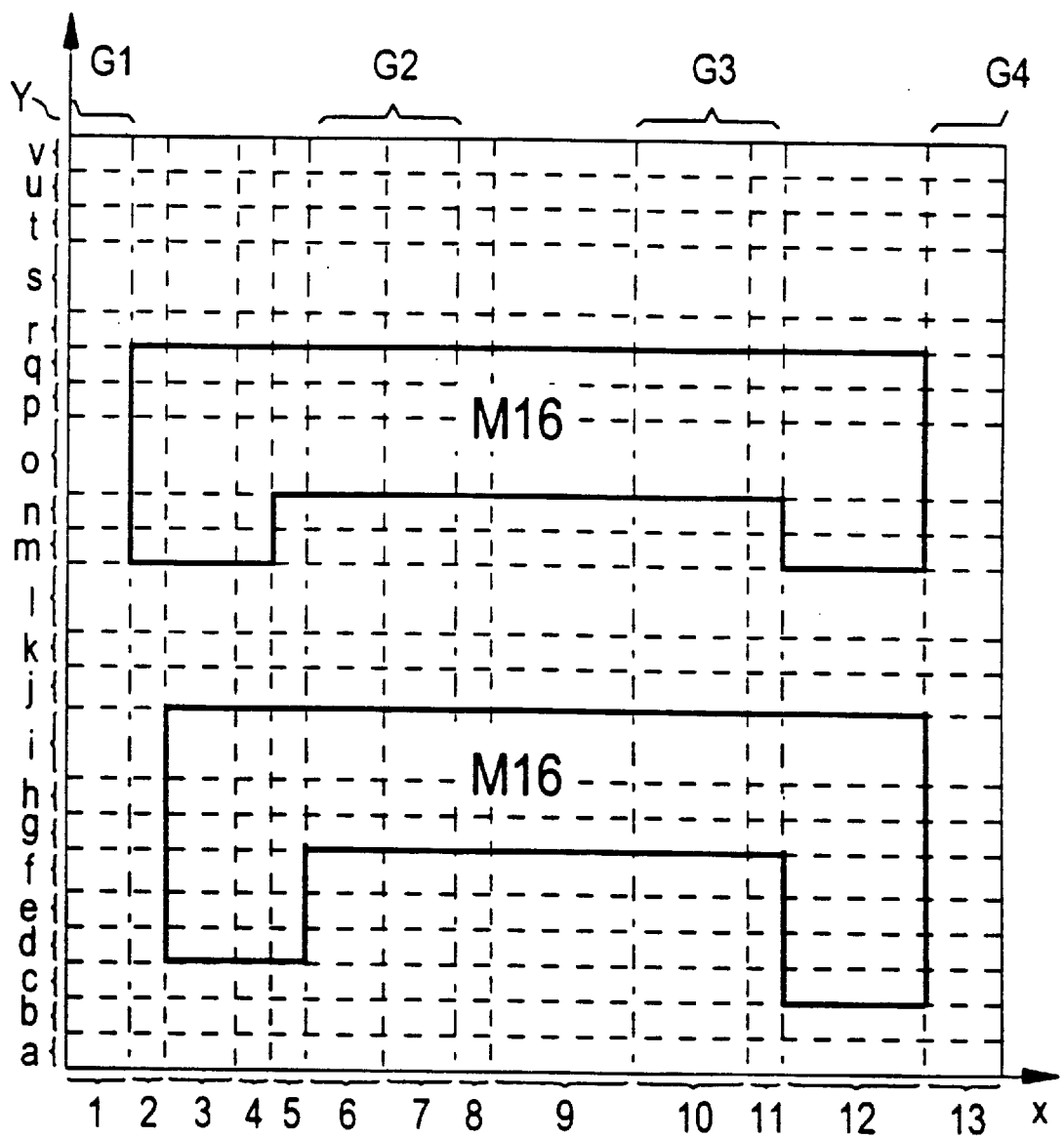
FIG. 7H shows the portion from FIG. 7G, whereupon a sixteenth mask was applied onto the surface.

Subsequently, tungsten is deposited in a thickness of approximately 200 nm. As a result, the second contacts K2, the fourth contacts K4, the fifth contacts KS and the sixth contacts arise (see FIGS. 5, 6B). Tungsten is etched with the assistance of a sixteenth mask M16 of photoresist (see FIG. 7H). As a result, fifth conductive structures LS and sixth conductive structures L6 arise (see FIGS. 5, 6B). $SF_6$, for example, is suitable as an etchant. The fifth conductive structures L5 adjoin a second contact K2 and a fourth contact K4. The sixth conductive structures L6 adjoin a fifth contact KS and a sixth contact.

To that end, the sixteenth mask M16 in the memory cells covers a first U-shaped region and a second U-shaped region. The first U25 shaped region is composed of regions wherein: the thirteenth horizontal region m through the seventeenth horizontal region q overlap with the second vertical region 2 through the fourth vertical region 4; wherein the fifteenth horizontal region o through the seventeenth horizontal region q overlap with the fifth vertical region 5 through the eleventh vertical region II; and wherein the thirteenth horizontal region m through the seventeenth horizontal region q overlap with the twelfth vertical region 12.

The second U-shaped region is composed of regions wherein: the fourth horizontal d through the ninth horizontal region I overlap with the third vertical region 3 through the fifth vertical region 5; wherein the seventh horizontal region g through the ninth horizontal region I overlap with the sixth vertical region 6 through the eleventh vertical region 11; and wherein the third horizontal region c through the ninth horizontal region I overlap with the twelfth vertical region 12.

Borophosphorous glass is deposited in a thickness of approximately 600 nm. The borophosphorous glass is planarized with the assistance of chemical-mechanical polishing. As a result, a fourth insulating structure 14 arises (see FIG. 6A). For producing first contacts KI that contact the second source/drain regions I S/D2 of the first transistors, third contacts that contact the first source/drain regions 3 S/DI of the third transistors, seventh contacts K7 that contact the second source/drain regions S/D2 of the fifth transistors, and eighth contacts that contact the second source/drain regions 6 S/D2 of the sixth transistors, borophosphorous glass is etched selectively, relative to silicon, with the assistance of a seventeenth mask (not shown) of photoresist until parts of the source/drain regions are uncovered. $C_2F_6+O_2$, for example, is suitable as an etchant.

To that end, the seventeenth mask in the memory cells does not cover regions wherein: the nineteenth horizontal region s through the twenty-first horizontal region u overlap with the second vertical region 2 through the fourth vertical region 4; wherein the nineteenth horizontal region s through the twenty-first horizontal region u overlap with the twelfth vertical region 12; wherein the eleventh horizontal region k through the thirteenth horizontal region m overlap with the ninth vertical region 9; and wherein the second horizontal region b through the fifth horizontal region e overlap with the ninth vertical region 9. Subsequently, tungsten is deposited in a thickness of approximately 300 nm and is etched back. As a result, the first contacts K1, the third contacts, the seventh contacts K7, and the eighth contacts arise (see FIGS. 6B, 6D).

Figure 7I:
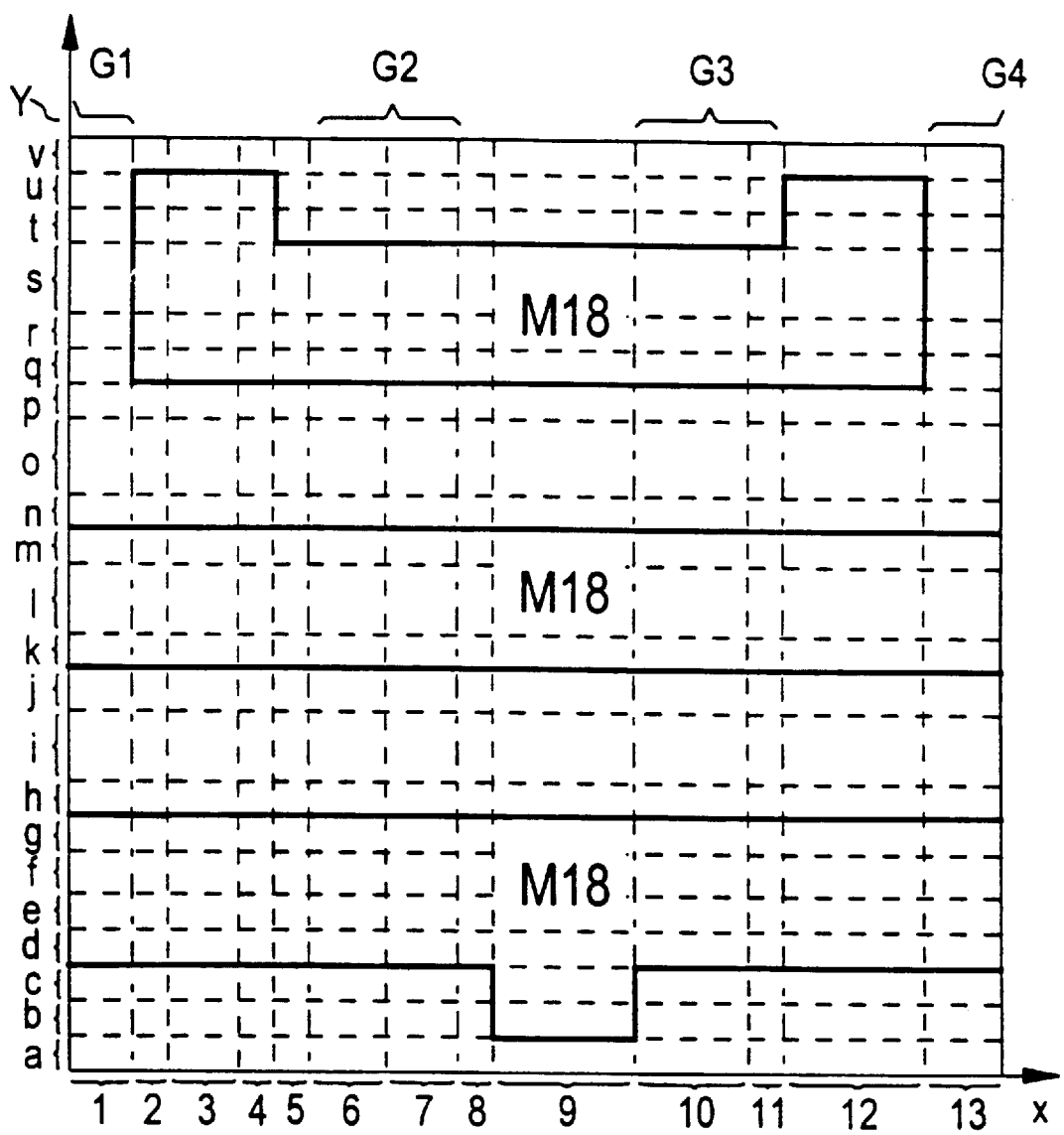
FIG. 7I shows the portion from FIG. 7A, whereupon an eighteenth mask was applied onto the surface.

Subsequently, AlSiCu is deposited in a thickness of approximately 500 nm and is structured with an eighteenth mask MI 8 of photoresist (see FIG. 7I) on the basis of an etching step. $BCl_3+Cl_2+N_2+CH_4$, for example, is suitable as an etchant. As a result, fourth conductor structures L4, first bit lines B1 and second bit lines B2 (see FIGS. 6A, 6B, 6D) arise. In a memory cell, a fourth conductor structure L4 adjoins a first contact Ki and a third contact. The first bit lines B1 are stripe-shaped, proceed perpendicularly to the first trenches Gi and adjoin the seventh contacts K7. The second bit lines B2 are essentially stripe-shaped, proceed parallel to the first bit lines B1 and adjoin the eighth contacts.

To that end, the eighteenth mask M18 in the memory cells cover regions wherein: the seventeenth horizontal region q through the twenty-first horizontal region u overlap with the second vertical region 2 through the fourth vertical region 4; wherein the seventeenth horizontal q through the nineteenth horizontal region s overlap with the fifth vertical region 5 through the eleventh vertical region 11; wherein the seventeenth horizontal region q through the twenty-first horizontal region u overlap with the twelfth region 12, the eleventh horizontal region k, the twelfth horizontal region I, the thirteenth horizontal region m, the fourth horizontal region d, the fifth horizontal region e, the sixth horizontal region t the seventh horizontal region g; and wherein the second horizontal region b and the third horizontal region c overlap with the nineteenth vertical region 9.

Many modifications of the exemplary embodiment are conceivable, which still would lie within the scope of the present invention. In particular, the dimensions of the described layers, regions, areas and trenches can be adapted to the respective requirements. The same is also true of the proposed dopant concentrations. Structures and layers of $SiO_2$ can, in particular, be produced by thermal oxidation or by a deposition process.

Polysilicon can be doped both during as well as following the deposition. Instead of doped polysilicon, metal suicides and/or metals, for example, can be employed. Instead of eroding deposited $SiO_2$ by chemical-mechanical polishing, re-etching also can be employed. The same considerations are also true for the generation of the conductive structure.

In sum, although the present invention has been described with reference to specific embodiments, those of skill in the art will recognize that changes may be made thereto without departing from the spirit and scope of the invention as set forth in the hereafter appended claims.

What is claimed is:

1. A method for manufacturing an SRAM cell arrangement which includes a plurality of memory cells, wherein the manufacture of each memory cell respectively comprises the steps of:

forming first, second, third, fourth, fifth and sixth vertical MOS transistors, wherein each transistor includes a gate electrode, a first source/drain region and a second source/drain region, and wherein the third and fourth transistors are complementary to the first, second, fifth and sixth transistors;

forming a word line, first bit line and second bit line, wherein the first bit line is formed transversely relative to the word line and the second bit line is formed parallel to the first bit line;

connecting the first source/drain region of the first transistor to both the first source/drain region of the second transistor and a first voltage terminal;

connecting the second source/drain region of the first transistor to each of the first source/drain region of the first transistor, the first source/drain region of the fifth transistor, the gate electrode of the second transistor and the gate electrode of the fourth transistor;

connecting the gate electrode of the first transistor to each of the second source/drain region of the second transistor, the first source/drain region of the fourth transistor, the gate electrode of the third transistor and the first source/drain region of the sixth transistor;

connecting the second source/drain region of the third transistor to each of the second source/drain region of the fourth transistor and the a second voltage terminal;

connecting the second source/drain region of the fifth transistor to the first bit line;

connecting the gate electrode of the fifth transistor to both the gate electrode of the sixth transistor and the word line;

connecting the second source/drain region of the sixth transistor to the second bit line;

forming first, second and fourth trenches in a substrate, wherein the first, second and fourth trenches are substantially parallel to each other, wherein the first and second transistors are adjacent a second side wall of the first trench wherein the fifth and sixth transistors are adjacent a second side wall of the second trench, wherein the third and fourth transistors are adjacent a first side wall of the fourth trench, and wherein the word line is arranged along the second side wall of the second trench;

providing the side walls of each of the first, second and fourth trenches with a gate dielectric;

forming a first conductive structure that is connected to the first voltage terminal along the first trench;

forming a second conductive structure that is connected to the second voltage terminal along the fourth trench;

connecting both the first source/drain region of the first transistor and the first source/drain region of the second transistor to the first conductive structure; and connecting both the second source/drain region of the third transistor and the second source/drain region of the fourth transistor to the second conductive structure.

2. A method for manufacturing an SRAM cell arrangement as claimed in claim 1, wherein the manufacture of each memory cell further respectively comprises the step of:

forming horizontal conductive structures for contacting one of gate electrodes and conductive structures outside each of the first trench, the second trench and the fourth trench above a surface of the substrate wherein the horizontal conductive structures are adjacent at least one of a gate electrode and a conductive structure.

3. An method for manufacturing an SRAM cell arrangement as claimed in claim 2, wherein the manufacture of each memory cell further respectively comprises the steps of forming, by implantation at the surface of the substrate, the first source/drain region of the first transistor, the second source/drain region of the second transistor, the second source/drain region of the fifth transistor, the second source/drain region of the sixth transistor, the first source/drain region of the third transistor and the first source/drain region of the fourth transistor, and thereafter forming the first, second and fourth trenches;

forming the second source/drain region of the first transistor, the second source/drain region of the second transistor, the second source/drain region of the fifth transistor, the sixth source/drain region of the sixth transistor, the first source/drain region of the third transistor, the first source/drain region of the fourth transistor and the first, second and fourth trenches, wherein the second source/drain region of the first transistor and the second source/drain region of the second transistor are adjacent the second side wall of the first trench and the first side wall of the second trench, wherein the second source/drain region of the fifth transistor and the second source/drain region of the sixth transistor are adjacent the second side wall of the second trench, and wherein the first source/drain region of the third transistor and the first source/drain region of the fourth transistor are adjacent the first side wall of the fourth trench;

forming a first diffusion region by oblique implantation adjacent the second source/drain region of the first transistor at the first side wall of the second trench within the substrate;

forming a second diffusion region by oblique implantation adjacent the second source/drain region of the second transistor at the first side wall of the second trench within the substrate;

forming the first conductive structure doped with a first conductivity type at a floor of the first trench by implantation within the substrate;

forming the first source/drain region of the fifth transistor and the first source/drain region of the sixth transistor by implantation at a floor of the second trench;

forming the second conductive structure doped by a second conductivity type which is opposite the first conductivity type by implantation at a floor of the fourth trench;

forming, by deposition, re-etching and masked etching of conductive material, each of the word line at the second side wall of the second trench, the gate electrode of the first transistor and the gate electrode of the second transistor at the second side wall of the first trench, a third conductive structure at the first side wall of the second trench, and the gate electrode of the third transistor and the gate electrode of the fourth transistor at the first side wall of the fourth trench;

forming a second insulating structure by deposition of insulating material onto the surface of the substrate;

forming a conductive layer by deposition of conductive material onto the second insulating structure;

forming first, second, third, fourth and fifth horizontal conductive structures by etching conductive material with the assistance of a fourteenth mask;

forming a third insulating structure by deposition and re-etching of insulating material;

forming each of a second contact adjacent the second source/drain region of the first transistor, a fifth contact adjacent the second source/drain region of the second transistor, a fourth contact adjacent the first source/drain region of the third transistor, a sixth contact adjacent the first source/drain region of the fourth transistor, a fifth conductive structure adjacent both the second contact and the fourth contact, and a sixth conductive structure that is adjacent both the fifth contact in the sixth contact, by etching an insulating material with the assistance of a fifteenth mask and by subsequently depositing and structuring conductive material with the assistance of a sixteenth mask;

forming a fourth insulating structure by deposition and re-etching of insulating material; and forming each of a first contact adjacent the first horizontal conductive structure, a third contact adjacent the third horizontal conductive structure, a seventh contact adjacent the second source/drain region of the fifth transistor, an eighth contact adjacent the second source/drain region of the sixth transistor, a fourth conductive structure adjacent both the first contact and the third contact, the first bit line adjacent the seventh contact and the second bit line adjacent the eighth contact, by etching an insulating material with the assistance of a seventeenth mask, and by subsequently depositing and structuring a conductive material with the assistance of an eighteenth mask.

4. A method for manufacturing an SRAM cell arrangement as claimed in claim 1, wherein the manufacture of each memory cell further respectively comprises the steps of:

forming a third trench which lies between the second and fourth trenches and is parallel thereto;

filling the third trench with insulating material to produce the first insulating structure; and forming highly doped channel stop regions by oblique implantation at parts of the side walls of the trenches at which no gate electrodes and no diffusion regions are adjacent.

5. A method for manufacturing an SRAM cell arrangement as claimed in claim 1, further comprising the step of:

arranging memory cells neighboring along the first bit line mirror-symmetrically relative to one another with reference to an axis that proceeds along a center line of one of a first trench and a fourth trench.

* * * * *